United States Patent
Elmufdi et al.

(10) Patent No.: US 9,292,640 B1
(45) Date of Patent: Mar. 22, 2016

(54) METHOD AND SYSTEM FOR DYNAMIC SELECTION OF A MEMORY READ PORT

(71) Applicant: Cadence Design Systems, Inc., San Jose, CA (US)

(72) Inventors: Beshara Elmufdi, San Jose, CA (US); Mitchell G. Poplack, San Jose, CA (US); Viktor Salittrennik, Berkeley, CA (US)

(73) Assignee: CADENCE DESIGN SYSTEMS INC., San Jose, CA (US)

( * ) Notice: Subject to any disclaimer, the term of this patent is extended or adjusted under 35 U.S.C. 154(b) by 0 days.

(21) Appl. No.: 14/529,090

(22) Filed: Oct. 30, 2014

(51) Int. Cl.
- *G06F 17/50* (2006.01)
- *G06F 12/12* (2006.01)
- *G06F 12/08* (2006.01)

(52) U.S. Cl.
CPC ........ *G06F 17/5045* (2013.01); *G06F 17/5027* (2013.01); *G06F 12/08* (2013.01); *G06F 12/121* (2013.01)

(58) Field of Classification Search
CPC ... G06F 17/5027; G06F 12/08; G06F 12/121; G06F 17/5022
USPC ...................... 703/23, 26; 711/125, 130, 133; 716/100, 106, 136
See application file for complete search history.

(56) References Cited

U.S. PATENT DOCUMENTS

| | | | | |
|---|---|---|---|---|
| 9,171,111 | B1* | 10/2015 | Elmufdi | G06F 17/5027 |
| 2006/0143522 | A1* | 6/2006 | Multhaup | G06F 11/261 714/28 |
| 2008/0104375 | A1* | 5/2008 | Hansen | G06F 9/30018 712/220 |
| 2009/0292523 | A1* | 11/2009 | Birguer | G06F 9/45537 703/23 |
| 2011/0072203 | A1* | 3/2011 | Corda | G06Q 20/045 711/103 |
| 2012/0320692 | A1* | 12/2012 | Schmitt | G06F 17/5027 365/189.17 |

\* cited by examiner

*Primary Examiner* — Stacy Whitmore
(74) *Attorney, Agent, or Firm* — Kaye Scholer LLP

(57) ABSTRACT

A method and system of dynamically selecting a memory read port are provided. In one form a method may comprises, in part, processing instructions in the emulation processors of a hardware functional verification system, storing output bits generated by the LUT in a plurality of storage elements, selecting between a plurality of previously-stored LUT output bits and the output port of the data memory, selecting one of the plurality of output bits stored in the storage elements, and sending the current data bit provided at the output port of the data memory to a selection circuit when previously-stored LUT output bits are provided. The disclosed systems and methods provide the ability all inputs to a LUT, even while a memory read port is occupied performing other operations during that emulation step, for example sending a value stored in the memory to another emulation processor using the selection circuit.

20 Claims, 5 Drawing Sheets

METHOD AND SYSTEM FOR DYNAMIC SELECTION OF A MEMORY READ PORT

FIELD

This patent document relates generally to the field of verifying the functionality of integrated circuit designs prior to fabrication. In particular, the present patent document relates to systems and methods for dynamic selection of a memory read port of a data memory of an emulation chip of a hardware functional verification system.

BACKGROUND

Functional verification systems, including hardware emulation systems and simulation acceleration systems, utilize interconnected programmable logic chips or interconnected processor chips. Examples of systems using programmable logic devices are disclosed in, for example, U.S. Pat. No. 6,009,256 entitled "Simulation/Emulation System and Method," U.S. Pat. No. 5,109,353 entitled "Apparatus for emulation of electronic hardware system," U.S. Pat. No. 5,036,473 entitled "Method of using electronically reconfigurable logic circuits," U.S. Pat. No. 5,475,830 entitled "Structure and method for providing a reconfigurable emulation circuit without hold time violations," and U.S. Pat. No. 5,960,191 entitled "Emulation system with time-multiplexed interconnect." U.S. Pat. Nos. 6,009,256, 5,109,353, 5,036,473, 5,475,830, and 5,960,191 are incorporated herein by reference. Examples of hardware logic emulation systems using processor chips are disclosed in, for example, U.S. Pat. No. 6,618,698 "Clustered processors in an emulation engine," U.S. Pat. No. 5,551,013 entitled "Multiprocessor for hardware emulation," U.S. Pat. No. 6,035,117 entitled "Tightly coupled emulation processors," U.S. Pat. No. 6,051,030 entitled "Emulation module having planar array organization," and U.S. Pat. No. 7,739,093 entitled "Method of visualization in processor based emulation system." U.S. Pat. Nos. 6,618,698, 5,551,013, 6,035,117, 6,051,030, and 7,739,093 are incorporated herein by reference.

Functional verification systems help to shorten the time it takes to design a customized application specific integrated circuits (ASICs) by allowing designers to emulate the functionality of the ASIC before a production run has begun. Functional verification systems help to ensure ASICs are designed correctly the first time, before a final product is produced.

According to some mechanisms, one of the outputs of an emulation processors data memory may be used to route bits from the memory to another emulation processor using a read port of the memory device. The desired destination may be, for example, an emulation processor located in a different emulation processor cluster. The output would then be routed to a particular emulation processor, which would occupy a read port of the memory during the transfer, making such memory read port unavailable to a lookup table (LUT) of the emulation processor that would typically receive data bits from the memory read port of the memory to perform processing. Other accesses to the memory read port other than for routing purposes may also render the memory read port unavailable to the LUT. Thus, as many as one bit from each emulation processor in the emulator, or one-fourth of all processor evaluations for a four-input lookup table based processor, for example, could be occupied during an emulation step of the emulation processor. Thus the memory read port would not be able to be used as another input to a lookup table, thus eliminating some flexibility in the system. For example, a four-input LUT would temporarily only be usable as a three-input LUT. It may be desirable to be able to send a value from a data memory to an alternate location outside of the processor where the data memory is located while still being able to use the full functionality of the LUT. Thus, for at least these reasons there is a need for an improved method and apparatus for selecting a memory read port.

SUMMARY

Systems and methods for dynamic selection of a memory read port of a data memory of an emulation chip of a hardware functional verification system are disclosed and claimed herein.

As described more fully below, the apparatus and processes of the embodiments disclosed permit improved systems and methods for dynamic selection of a memory read port of a data memory of an emulation chip of a hardware functional verification system. Further aspects, objects, desirable features, and advantages of the apparatus and methods disclosed herein will be better understood and apparent to one skilled in the relevant art in view of the detailed description and drawings that follow, in which various embodiments are illustrated by way of example. It is to be expressly understood, however, that the drawings are for the purpose of illustration only and are not intended as a definition of the limits of the claimed embodiments.

To this end, systems and methods for dynamic selection of a memory read port of a data memory of an emulation chip of a hardware functional verification system are provided.

In one form, a hardware functional verification system is provided, the hardware functional verification system comprising a plurality of interconnected emulation chips, at least one of the emulation chips comprising: a plurality of emulation processors, wherein at least one of the plurality of emulation processors comprises: a data memory to store a plurality of data bits, wherein a data bit of the plurality of data bits is provided at a first memory read port of a plurality of memory read ports, and one or more data bits of the plurality of data bits are provided at a second or more memory read ports of the plurality of memory read ports as inputs to a lookup table; a first selection circuit having at least one output and a plurality of inputs to dynamically select from a current output of the first memory read port of the data memory and a prior output of the first memory read port in an emulation step; a lookup table to process the at least one output of the first selection circuit and the one or more data bits from the second or more memory read ports according to an instruction, wherein the lookup table comprises an output; a plurality of storage elements to store the output of the lookup table for at least one emulation step, wherein the output of the plurality of storage elements is coupled to the input of the first selection circuit; a second selection circuit that receives an input from the first selection circuit wherein the input from the second selection circuit contains data previously stored in at least one of a plurality of storage elements; and wherein an output of the data memory is sent to a third selection circuit.

In some embodiments, the first selection circuit comprises a multiplexer. In certain embodiments, the first selection circuit receives an input from a second selection circuit. The second selection circuit may comprise a bypass multiplexer. Typically, the input from the second selection circuit contains data previously stored in at least one of the plurality of storage elements.

In certain embodiments, the first selection circuit sends data previously stored in at least one of the plurality of storage elements. In some embodiments, an output from the data memory is sampled for data. An output of the data memory may be sent to a third selection circuit. In some embodiments, three outputs from the data memory are sent directly to the lookup table as data inputs. In certain embodiments, an output of the data memory comprising data may be sent to a third selection circuit.

In some embodiments, a fourth input is sent to the lookup table containing data previously stored in a first selection circuit. Data previously stored in a first selection circuit may be sent through a second selection circuit. In certain embodiments, the data memory comprises a number of outputs, and the lookup table comprises a number of inputs, such that the number of outputs from the data memory equals the number of inputs to the lookup table. The data memory may comprise any number of memory read ports. The plurality of storage elements may be shift registers.

In one form, an emulation processor is provided, the emulation processor comprising: a data memory to store a plurality of data bits, wherein a data bit of the plurality of data bits is provided at a first memory read port of a plurality of memory read ports, and one or more data bits of the plurality of data bits are provided at a second or more memory read ports of the plurality of memory read ports as input to a lookup table; a first selection circuit having at least one output and a plurality of inputs to dynamically select from a current output of the first memory read port of the data memory and a prior output of the first memory read port in an emulation step; a lookup table to process the at least one output of the first selection circuit and the one or more data bits from the second or more memory read ports according to an instruction, wherein the lookup table comprises an output; a plurality of storage elements to store the output of the lookup table for at least one emulation step, wherein the output of the plurality of storage elements is coupled to the input of the first selection circuit; a second selection circuit that receives an input from the first selection circuit wherein the input from the second selection circuit contains data previously stored in at least one of a plurality of storage elements; and wherein an output of the data memory is sent to a third selection circuit.

In one form, a method of dynamically selecting a memory read port is provided, the method comprising: providing a data bit of a plurality of data bits stored in a data memory to a first memory read port of a plurality of memory read ports, and providing one or more data bits of the plurality of data bits to a second or more memory read ports of the plurality of memory read ports as inputs to a lookup table; selecting a current output of the first memory read port of the data memory and a prior output of the first memory read port in an emulation step by a first selection circuit having at least one output and a plurality of inputs; processing the at least one output of the first selection circuit and the one or more data bits from the second or more memory read ports in a lookup table according to an instruction, wherein the lookup table comprises an output; storing the output of the lookup table for at least one emulation step in a plurality of storage elements, wherein the output of the plurality of storage elements is coupled to the input of the first selection circuit; sending an input to the first selection circuit from a second selection circuit, wherein the input from the second selection circuit contains data previously stored in at least one of the plurality of storage elements; and wherein an output of the data memory is sent to a third selection circuit.

These and other objects, features, aspects, and advantages of the embodiments will become better understood with reference to the following description and accompanying drawings.

BRIEF DESCRIPTION OF THE DRAWINGS

The accompanying drawings, which are included as part of the present specification, illustrate the presently preferred embodiments and together with the general description given above and the detailed description of the preferred embodiments given below serve to explain and teach the principles described herein.

Figure 1:
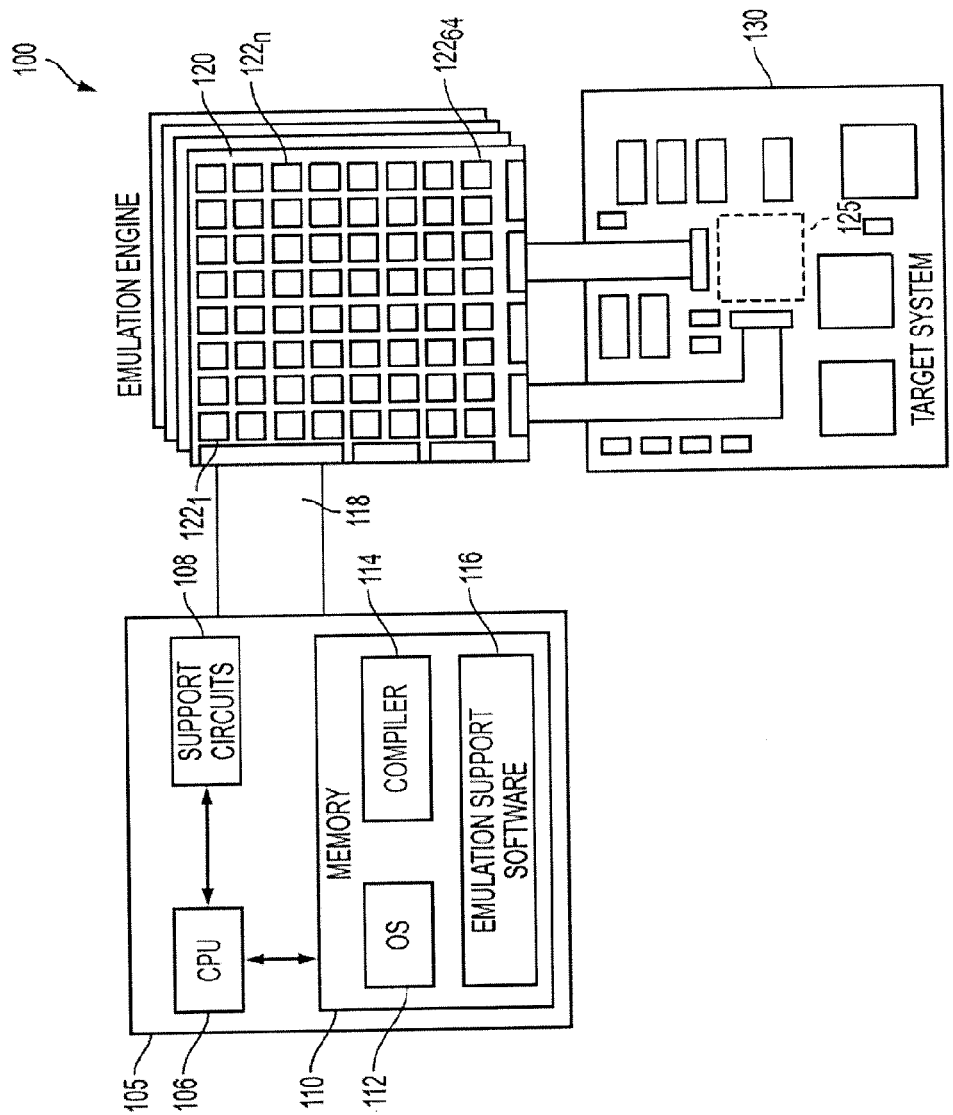
FIG. 1 is an illustration of an overview of a processor-based emulator system (processor-based hardware functional verification system).

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

A method and apparatus for dynamic selection of a memory read port of a data memory of an emulation chip of a hardware functional verification system is disclosed. Each of the features and teachings disclosed herein can be utilized separately or in conjunction with other features and teachings. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the various embodiments described herein. However, it will be apparent to one skilled in the art that these specific details are not required to practice the concepts described herein.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm may be here, and generally, conceived to be a self-consistent sequence of steps leading to a desired result. The steps may be those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Also disclosed is an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), erasable programmable read-only memories (EPROMs), electrically erasable programmable read-only memories (EEPROMs), magnetic or optical cards, or any type of media suitable for storing electronic instructions, and each coupled to a computer system bus.

Any algorithms that may be presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the present teachings.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

FIG. 1 illustrates an overview of an embodiment of a processor-based emulation system 100. The system comprises a host or computer workstation 105, an emulation engine including at least one emulation board 120, and a target system 130. While a processor-based emulation engine is described, though other emulation engines, such as those utilizing arrays of programmable logic devices (such as FPGAs) may also be used, for example properly-configured versions of the systems discussed above.

The host workstation 105 provides emulation support facilities to the emulation engine 100 and emulation board 120. The host workstation 105, for example a personal computer, may comprise at least one central processing unit (CPU) 106, support circuits 108, and a memory 110. The CPU 106 may comprise one or more conventionally available microprocessors and/or microcontrollers. The support circuits 108 may be well known circuits that are used to support the operation of the CPU 106. These supporting circuits may comprise power supplies, clocks, input/output interface circuitry, cache, and other similar circuits.

Memory 110, sometimes referred to as main memory, may comprise random access memory, read only memory, disk memory, flash memory, optical storage, and/or various combinations of these types of memory. Memory 110 may in part be used as cache memory or buffer memory. Memory 110 may store various forms of software and files for the emulation system, such as an operating system (OS) 112, a compiler 114, and emulation support software 116.

The compiler 114 converts a hardware design, such as hardware described in VHDL or Verilog programming language, to a sequence of instructions that can be evaluated by the emulation board 120.

The host workstation 105 allows a user to interface with the emulation engine 100 via communications channel 118, including emulation board 120, and control the emulation process and collect emulation results for analysis. Under control of the host workstation 105, programming information and data is loaded to the emulation engine 100. The emulation board 120 has on it a number of individual emulation chips, for example the 64 emulation chips $122_1$ to $122_{64}$ (collectively 122) shown in FIG. 1, in addition to miscellaneous support circuitry. There may be any number of emulation chips. The emulation chips 122 are designed to mimic the functionality of any synchronous ASIC design using programmable logic. This is done in order for chip designers to prototype their ASIC design using processor based emulation before having actual silicon in hand. Communication between emulation chips 122 is established via serial I/Os links. There may be numerous output lanes per emulation chip 122. Some of the I/Os links may remain on the card on copper. For longer connections to other cards, the signals may be relayed through optical transceivers and cables.

In response to programming received from the emulation support software 116, emulation engine 100 emulates a portion 125 of the target system 130. Portion 125 of the target system 130 may be an integrated circuit, a memory, a processor, or any other object or device that may be emulated in a programming language. Exemplary emulation programming languages include Verilog and VHDL.

Figure 2:
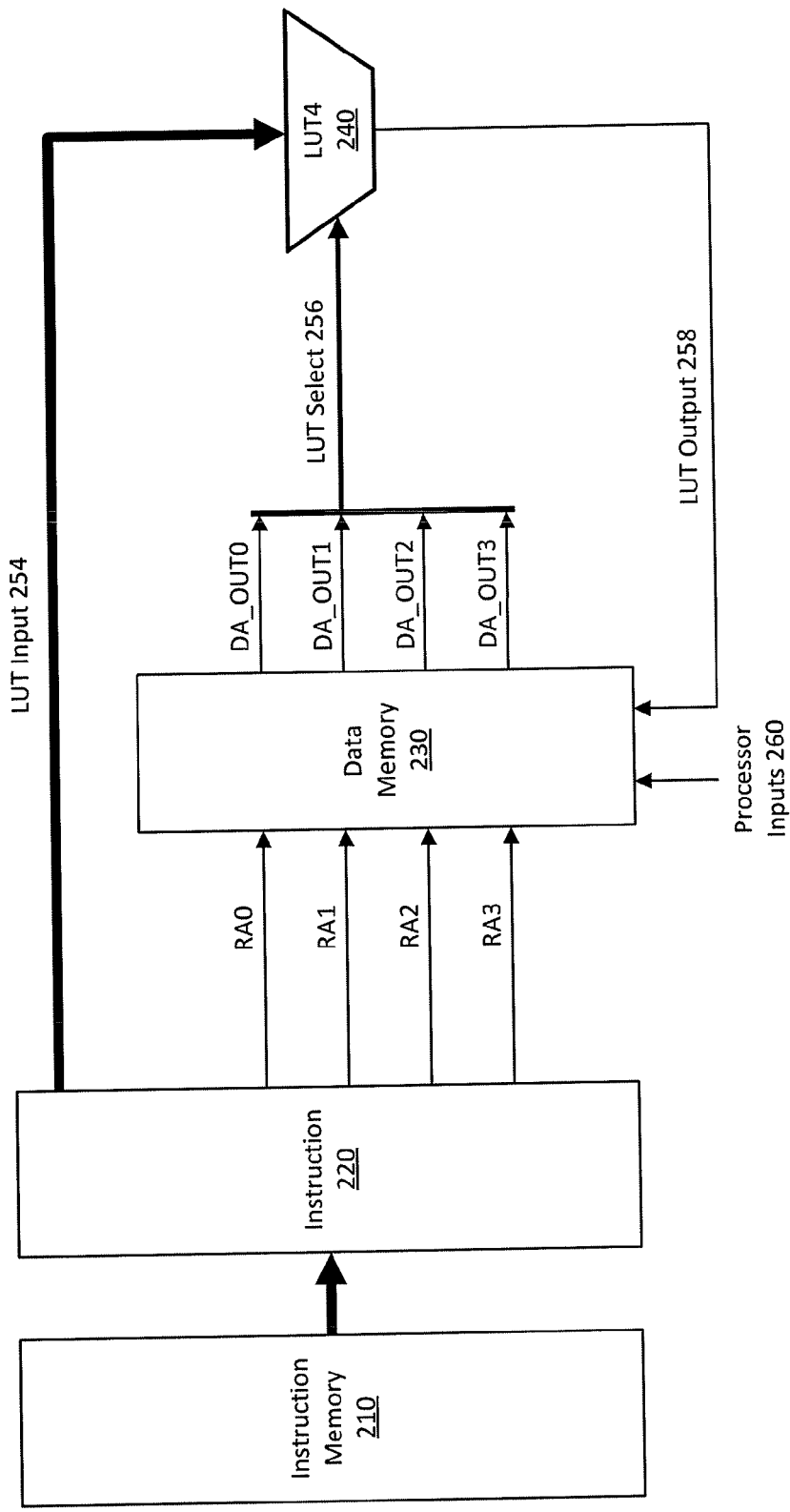
FIG. 2 is an illustration of an emulation processor.

FIG. 2 illustrates a single emulation processor 200 within an emulation chip 122, according to an embodiment. An instruction memory 210 is read sequentially and provides instructions 220 that are used to read bits out of a data memory 230. LUT select 256 bits are read from the data memory 230 and fed to a lookup table ("LUT") 240 that is controlled by the instruction. Here, the LUT 240 is a four-input LUT ("LUT4"). The result of the LUT function, LUT output 258 is then stored back into the data memory 230. Data memory 230 contains the results of previous LUT evaluations. The data memory 230 also stores inputs 260 that come from outside the processor, i.e. from other processors. As a result, the LUT 240 not only has access to all previous results in data memory 230, but also values from outside the processor 260.

A LUT may be a multiplexer which can be used to represent any Boolean function which has the same number of inputs as the number of select inputs of the multiplexer. For example, a 4 way multiplexer may have 2 select inputs and 4 data inputs. By varying the values of the data inputs, any 2 bit Boolean function can be emulated using the multiplexer.

In some embodiments, the emulation chip 122 uses LUT4s that can perform any 4 bit Boolean function as the basis of its processors. LUT4s have been shown to be a good compromise between size and computational capacity. LUTs with more inputs may require an exponentially larger number of data inputs to be stored, and more LUTs may be required to perform the same Boolean function if the number of select inputs per LUT is smaller.

The instruction memory 210 has a depth that reflects the number of instruction words that may be stored therein. The time to execute a single instruction word by the processor occurs is one step or emulation step. An emulation cycle is usually one pass through the instruction memory until the program depth is reached, and the number of steps in the cycle is equal to the program depth. The program depth can be the depth of the instruction memory, or the cycle may also be shorter.

The data memory 230 stores the results of processor evaluations and inputs to the processor block. This data memory 230 may typically have a number of single bit read ports that is equal to the number of select inputs of the processor (4 in the FIG. 2 embodiment) and 1 wide write port to write the result of the LUT evaluation and the processor inputs. This memory stores a number of steps (1 step is 1 clock cycle) worth of LUT evaluation outputs and processor inputs so that they can be accessed later on for use in LUT evaluation. In some embodiments, the number of steps per cycle equals program depth. The data memory depth may typically be equal to the instruction memory depth.

In some embodiments, the emulation processor itself may indicate whether or not to capture the value that it generates; on a given step, instruction memory 210 may indicate the destination of the emulation processor output according to an instruction field. In some embodiments, the processor output may be sent to other locations for any number of purposes, including to locations outside of the processor.

Figure 3:
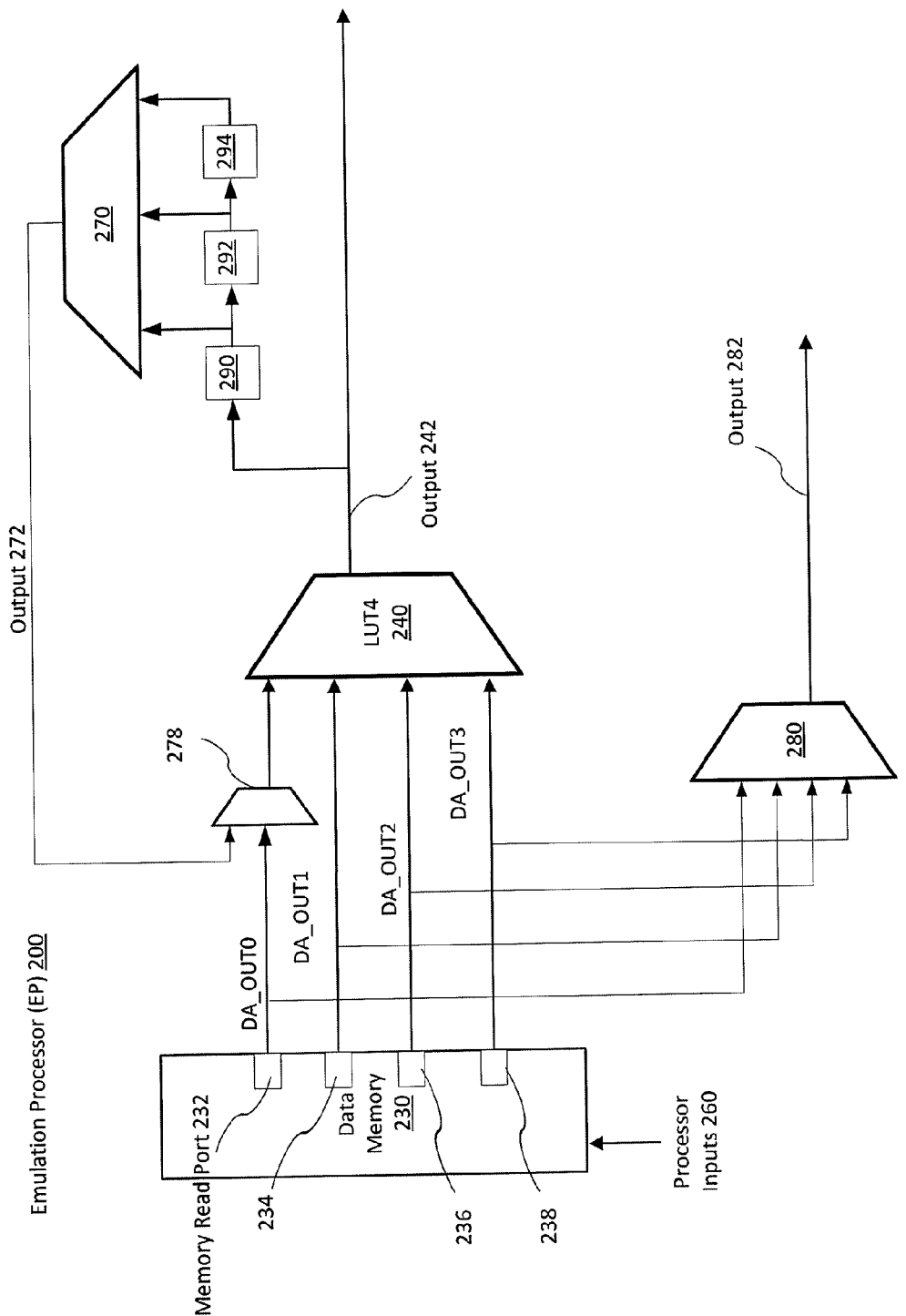
FIG. 3 is an illustration of an emulation processor with additional selection circuitry.

FIG. 3 is another illustration of some components of a single emulation processor 200 within an emulation chip 122, according to an embodiment. A processor-based emulation system or hardware functional verification system 100 according to an embodiment may comprise a plurality of interconnected emulation chips 122, where at least one of the emulation chips 122 may comprise a plurality of emulation processors 200.

At least one of the plurality of emulation processors 200 according to an embodiment may comprise a data memory 230 to store a plurality of instructions (RA0, RA1, RA2, RA3, and processor inputs 260, where "RA" means "read address"), wherein a plurality of outputs of the data memory (DA_OUT0, DA_OUT1, DA_OUT2, DA_OUT3) are sent from memory read ports (232, 234, 236, 238), and wherein the memory read ports (232, 234, 236, 238) output to a 4-input lookup table (LUT4) 240. In some embodiments, there is a first selection circuit 278 between the data memory 230 and the lookup table 240. According to an embodiment, the lookup table 240 may have an output 242, wherein the output 242 of the lookup table 240 is stored for at least one clock cycle in a chain of storage elements (290, 292, 294) wherein the output of each storage element is coupled to the input of a second selection circuit 270. In some embodiments, the second selection circuit 270 may be a bypass multiplexer, a combination of multiplexers, or a similar selection circuit. In some embodiments, the first selection circuit 278 may comprise a multiplexer, a combination of multiplexers, or a similar selection circuit. In some embodiments, the storage elements (290, 292, 294) may be shift registers comprising flip-flops or latches.

In an exemplary embodiment, a second selection circuit 270 needs fewer instruction bits than reading from the data memory directly. By using the second selection circuit 270, at least one data memory read port is made available for other uses than being sent to the lookup table 240. The saved instruction bits and freed data memory port can then be used to send an instruction bit to other locations, including locations outside of the processor 200.

The output of a storage element may be sent back to the lookup table 240 as an input such that the number of outputs from the data memory 230 may equal the number of inputs to the lookup table 240. The output 272 comprising data previously stored in a storage element may enter a first selection circuit 278 prior to lookup table 240. In some embodiments, an output of the data memory may be sent to a third selection circuit 280. In certain embodiments, the third selection circuit 280 may be an NB output (NBO) multiplexer. In some embodiments, the third selection circuit 280 has an output 282 that may contain data from the data memory 230. It is contemplated that the output 282 may contain data. In some embodiments output 282 may contain many forms of data, including, for example, trace data. In some embodiments, the lookup table 240 may be driven from a circuit different from the data memory 230. It is contemplated that and to be able to send a value from the data memory 230 may be sent to an alternate location outside of the emulation processor 200, such as to another emulation processor, another emulation processor within another processor cluster, or elsewhere. In an exemplary embodiment, the second selection circuit 270 is used to drive the input of the LUT so that a value can be sent from the read port of the data memory 230 to the third selection circuit 280.

According to an embodiment, the DA_OUT0 output from data memory 230 may be sampled for data, where the DA_OUT0 output is sent to the third selection circuit 280 instead of being used as a data input by the lookup table 240. Then, there are just the three inputs to the lookup table 240 DA_OUT1, DA_OUT2, and DA_OUT3. However, a fourth input may be provided to supplement these three inputs, by using output data from the lookup table 240 that has been stored in a storage element 290, 292, or 294. Such stored data may be sent through the second selection circuit 270 as output 272 to the first selection circuit 278, where the data may then be used as a fourth input to lookup table 240, such that the number of outputs from the data memory 230 may equal the number of inputs to the lookup table 240.

At least one of the plurality of emulation processors 200 according to an embodiment may comprise a data memory 230 to store a plurality of data bits, wherein a data bit of the plurality of data bits is provided at a first memory read port of a plurality of memory read ports 232, 234, 236, and 238, and one or more data bits of the plurality of data bits are provided at a second or more memory read ports of the plurality of memory read ports 232, 234, 236, and 238 as an output (DA_OUT0, DA_OUT1, DA_OUT2, DA_OUT3) to a lookup table 240.

At least one of the plurality of emulation processors 200 according to an embodiment may comprise a first selection circuit 278 having at least one output and a plurality of inputs to dynamically select from a current output DA_OUT0 of the first memory read port 232 of the data memory 230 and a prior output 272 of the first memory read port in an emulation step. Here, the first selection circuit 278 provides output 272 back to LUT4 240 on the DA_OUT0 signal line, but first selection circuit 278 may alternatively be connected into any or all of the signal lines DA_OUT1, DA_OUT2, and DA_OUT3.

At least one of the plurality of emulation processors 200 according to an embodiment may comprise a lookup table 240 to process the at least one output of the first selection circuit 278 and the one or more data bits from the second or more memory read ports according to an instruction, wherein the lookup table 240 has an output 242.

At least one of the plurality of emulation processors 200 according to an embodiment may comprise a plurality of storage elements to store the output of the lookup table 240 for at least one emulation step, wherein the output of the plurality of storage elements (290, 292, 294) is coupled to the input of the first selection circuit 278. The number of emulation steps for which the output of the lookup table 240 is stored may be determined by the number of storage elements provided. In this embodiment, three storage elements 290, 292, and 294 allow for the storage of an output of the lookup table 240 for three emulation steps before the output is discarded. In other embodiments, a greater or fewer number of storage elements may be provided. For example, as many as 1,024 storage elements may be desired to provide prior processor outputs 242 for up to 1,024 emulation steps after the output is generated. The selection circuit 270 would then be scaled accordingly, for example by using a ten-bit select input.

The first selection circuit 278 typically receives as an input the output 272 from the second selection circuit 270. The output 272 from the second selection circuit 270 contains data previously stored in at least one of the storage elements (290, 292, 294). The first selection circuit 278 then sends data that has been previously stored in one of the storage elements (290, 292, 294) to the lookup table 240 to replace as an input DA_OUT0. Providing access to the previously stored output data frees up the memory port for other uses, such as routing data previously stored in the data memory to other processor, as well as bits in the instructions.

It is contemplated that there may be any number of storage elements. The number of storage elements determines the length of time for which the data can be stored to be sent back to the lookup table 240. The larger the number of storage elements, the longer the time the data can be stored before being sent back to the lookup table 240. The second selection circuit 270 typically needs a number of inputs sufficient to select from the registers.

In some embodiments, an output DA_OUT0 from the data memory 230 may be sampled for data, and the output of the data memory 230 comprising data may be sent to a third selection circuit 280. In certain embodiments, an output DA_OUT0 from the data memory 230 may be sampled for other types of data, and the output of the data memory 230 comprising the data may be sent to a third selection circuit 280 or other locations. Typically, the three outputs DA_OUT1, DA_OUT2, and DA_OUT3 from the data memory 230 may be sent directly to the lookup table 240 as data inputs. The fourth input may be sent to the lookup table 240 with data previously stored in the first selection circuit 278. The data previously stored in a selection circuit 278 may be sent from the second selection circuit 270. The data memory 230 may have a number of outputs, and the lookup table comprises a number of inputs, such that the number of outputs from the data memory 230 equals the number of inputs to the lookup table 240. In some embodiments, the data memory 230 may have at least four memory read ports (232, 234, 236, 238). In other embodiments, the data memory 230 may contain any number of outputs. In some embodiments, the lookup table 240 may contain any number of inputs.

Figure 4:
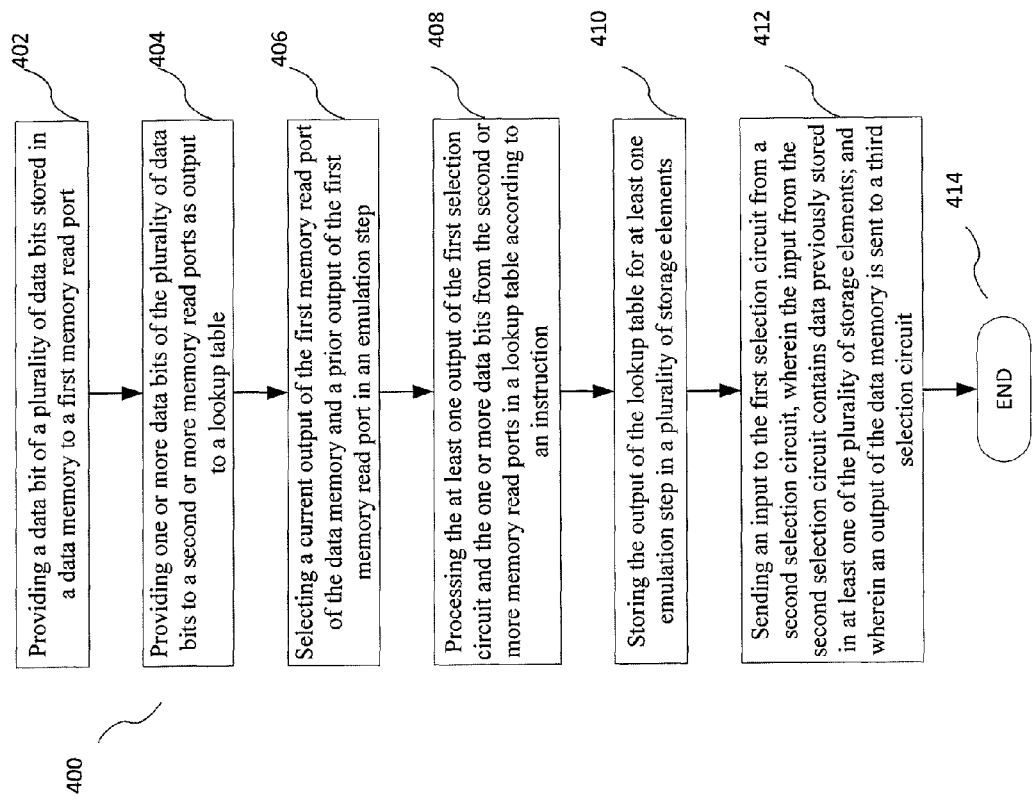
FIG. 4 illustrates a flow diagram of a method for dynamic selection of a memory read port of a data memory of an emulation chip of a hardware functional verification system according to an exemplary embodiment.

FIG. 4 illustrates a flow diagram of a method 400 for dynamic selection of a memory read port of a data memory of an emulation chip of a hardware functional verification system according to an exemplary embodiment. It should be appreciated that this method can be repeated during each emulation step of the emulation process. In other words, once the method ends at step 412, the method may be performed again beginning at the next step during the emulation process.

In block 402, the method provides a data bit of a plurality of data bits stored in a data memory to a first memory read port of a plurality of memory read ports. Next, block 404 provides one or more data bits of the plurality of data bits to a second or more memory read ports of the plurality of memory read ports as input to a lookup table. In block 406, the method selects a current output of the first memory read port of the data memory and a prior output of the first memory read port in an emulation step by a first selection circuit having at least one output and a plurality of inputs. Block 408 processes the at least one output of the first selection circuit and the one or more data bits from the second or more memory read ports in a lookup table according to an instruction, wherein the lookup table comprises an output. Then in block 410, the method stores the output of the lookup table for at least one emulation step in a plurality of storage elements, wherein the output of the plurality of storage elements is coupled to the input of the first selection circuit. Next, in block 412, the method sends an input to the first selection circuit from a second selection circuit, wherein the input from the second selection circuit contains data previously stored in at least one of the plurality of storage elements; and wherein an output of the data memory is sent to a third selection circuit. The method ends at block 414 and can be repeated again during the next emulation step of the emulation process.

The emulation system and method described herein provides an advantage where by using a bypass multiplexer, at least one instruction bit and data memory read ports are freed, which can allow for a bit to then be sent to other locations. The data provided from this processor may become an input to locations outside of this processor, such as, for example, to other processors. It is contemplated that the bypass may require fewer instruction bits than reading directly from the data memory, and also may free up at least a portion of the data memory ports. Thus, the saved instruction bits and data memory port can be used to send a bit to other locations outside of the processor. Furthermore, a second selection circuit may be used to drive the input of a LUT so that a value can be sent from a read port of a data memory to a third selection circuit.

Figure 5:
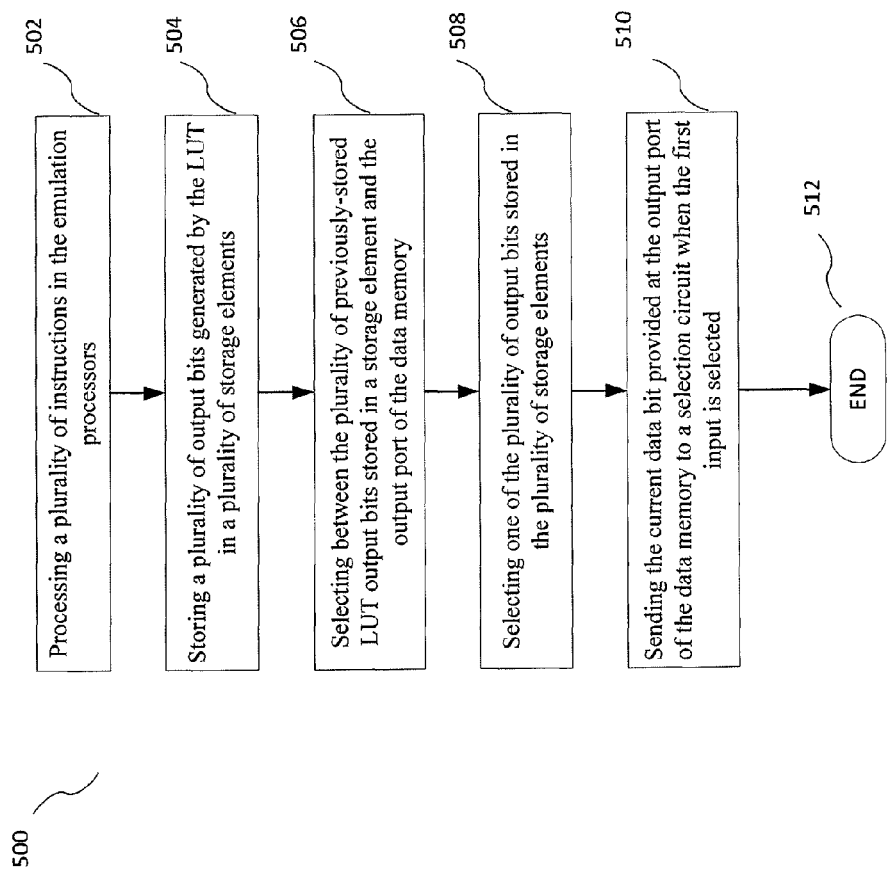
FIG. 5 illustrates another flow diagram of a method for dynamic selection of a memory read port according to an exemplary embodiment.

FIG. 5 illustrates another flow diagram of a method 500 for dynamic selection of a memory read port in an emulation processor of a hardware functional verification system according to an exemplary embodiment. It should be appreciated that this method can be repeated during each emulation step of the emulation process. In other words, once the method ends at step 510, the method may be performed again beginning at the next emulation step during the emulation process, or only certain steps of the method may be repeated.

In block 502, the method processes a plurality of instructions using a lookup table (LUT) of a plurality of LUTs in the emulation processor. In certain embodiments, the emulation processor may be one of a plurality of emulation processors arranged into an emulation processor cluster. The hardware functional verification system may contain any number of such emulation processor clusters. In block 504 the method stores a plurality of output bits generated by the LUT into a plurality of storage elements. In other embodiment the storage elements may be shift registers comprising flip flops or latches. In block 506, the method selects between a first input and a second input to provide to a selection input of the LUT.

The first input may be one of the plurality of previously-stored LUT output bits stored in one of the plurality of storage elements. The second input may be a current data bit provided at an output port of a data memory for the LUT. In block 508 the method selects one of the plurality of output bits stored in the plurality of storage elements, which may be performed using a selection circuit such as a multiplexes with inputs corresponding to each output of the plurality of storage elements. In block 510, the method sends the current data bit provided at the output port of the data memory to a selection circuit when the first input is selected. In certain embodiments, such selection circuit may be a multiplexer having plurality of inputs whose source is a plurality of output ports from a plurality of emulation processor data memories found in a single emulation processor cluster. The output of the multiplexer may be coupled to a bus interconnecting a plurality of such emulation processor clusters fabricated on a single emulation chip of the hardware functional verification system. The method ends at block 512, and can be repeated again during the next emulation step of the emulation process.

Although the embodiments have been described with reference to the drawings and specific examples, it will readily be appreciated by those skilled in the art that many modifications and adaptations of the apparatuses and processes described herein are possible without departure from the spirit and scope of the embodiments as claimed hereinafter. Thus, it is to be clearly understood that this description is made only by way of example and not as a limitation on the scope of the claims.

We claim:

1. A hardware functional verification system comprising a plurality of emulation chips, at least one of the emulation chips comprising:
   a first data memory having a first memory read port to provide a memory output;
   a lookup table (LUT) to run a plurality of instructions to generate a plurality of processor output bits at a processor output;
   a first selection circuit, comprising an output coupled to a first select port of the LUT, a first input coupled to the first memory read port to receive the memory output, and a second input to receive a plurality of prior processor output bits, wherein one of the memory output and a prior processor output bit of the plurality of prior processor output bits is provided at the output according to a first selection signal;
   a second selection circuit having a first input of a plurality of inputs coupled to the first memory read port to select the memory output when the prior processor output bit is provided at the output of the first selection circuit.

2. The hardware functional verification system of claim 1, wherein the first selection circuit comprises a multiplexer.

3. The hardware functional verification system of claim 1, further comprising a plurality of storage elements to store the prior processor output bits for at least one emulation step.

4. The hardware functional verification system of claim 3, further comprising a third selection circuit to select one of the plurality of prior processor output bits stored in the plurality of storage elements to provide to the second input of the first selection circuit.

5. The hardware functional verification system of claim 3, wherein the plurality of storage elements comprise shift registers.

6. The hardware functional verification system of claim 1, wherein the LUT is a four-input LUT.

7. The hardware functional verification system of claim 1, wherein the emulation chip comprises a plurality of interconnected processor clusters, wherein at least one of the plurality of interconnected processor clusters comprises the first data memory, the LUT, the first selection circuit, and the second selection circuit.

8. An emulation chip comprising:
   a first data memory having a first memory read port to provide a memory output;
   a lookup table (LUT) to run a plurality of instructions to generate a plurality of processor output bits at a processor output;
   a first selection circuit, comprising an output coupled to a first select port of the LUT, a first input coupled to the first memory read port to receive the memory output, and a second input to receive a plurality of prior processor output bits, wherein one of the memory output and a prior processor output bit of the plurality of prior processor output bits is provided at the output according to a first selection signal;
   a second selection circuit having a first input of a plurality of inputs coupled to the first memory read port to select the memory output when the prior processor output bit is provided at the output of the first selection circuit.

9. The emulation chip of claim 8, wherein the first selection circuit comprises a multiplexer.

10. The emulation chip of claim 8, further comprising a plurality of storage elements to store the prior processor output bits for at least one emulation step.

11. The emulation chip of claim 10, further comprising a third selection circuit to select one of the plurality of prior processor output bits stored in the plurality of storage elements to provide to the second input of the first selection circuit.

12. The emulation chip of claim 10, wherein the plurality of storage elements comprise shift registers.

13. The emulation chip of claim 8, wherein the LUT is a four-input LUT.

14. The emulation chip of claim 8, wherein the emulation chip comprises a plurality of interconnected processor clusters, wherein at least one of the plurality of interconnected processor clusters comprises the first data memory, the LUT, the first selection circuit, and the second selection circuit.

15. A method of selecting a memory read port in an emulation processor of a hardware functional verification system, comprising:
   processing a plurality of instructions using a lookup table (LUT) of a plurality of LUTs in the emulation processor;
   storing a plurality of output bits generated by the LUT in a plurality of storage elements;
   selecting between a first input and a second input to provide to a selection input of the LUT, wherein the first input is one of the plurality of previously-stored LUT output bits stored in one of the plurality of storage elements, and wherein the second input is a current data bit provided at an output port of a data memory for the LUT; and
   sending the current data bit provided at the output port of the data memory to a selection circuit when the first input is selected.

16. The method of claim 15, wherein the plurality of storage elements comprise shift registers.

17. The method of claim 15, further comprising selecting one of the plurality of output bits stored in the plurality of storage elements.

18. The method of claim 15, wherein the emulation processor is one of a plurality of emulation processors arranged into an emulation processor cluster.

19. The method of claim 18, wherein the selection circuit is a multiplexer having plurality of inputs, wherein each of the plurality of inputs is coupled to a read port of one of a plurality of data memories of the emulation processor cluster, including the data memory.

20. The method of claim 19, wherein the selection circuit is a multiplexer having plurality of inputs and an output, wherein the output is coupled to a bus interconnecting a plurality of emulation processor clusters in an emulation chip of the hardware functional verification system.

\* \* \* \* \*